United States Patent [19]

Nishioka et al.

[11] Patent Number: 4,809,052
[45] Date of Patent: Feb. 28, 1989

[54] SEMICONDUCTOR MEMORY DEVICE

[75] Inventors: Yasushiro Nishioka, Hachioji; Takeo Shiba, Kodaira; Hiroshi Shinriki, Tokyo; Kiichiro Mukai, Hachioji; Akihisa Uchida, Tachikawa; Ichiro Mitamura; Keiichi Higeta, both of Ome; Katsumi Ogiue, Tokyo; Kunihiko Yamaguchi, Sayama; Noriyuki Sakuma, Hachioji, all of Japan

[73] Assignee: Hitachi, Ltd., Tokyo, Japan

[21] Appl. No.: 860,413

[22] Filed: May 7, 1986

[30] Foreign Application Priority Data

May 10, 1985 [JP] Japan .................................. 60-97766
Aug. 2, 1985 [JP] Japan .................................. 60-169808
Nov. 25, 1985 [JP] Japan .................................. 60-262434

[51] Int. Cl.$^4$ ..................... H01L 27/10; H01L 29/48; H01L 29/40
[52] U.S. Cl. ........................................ 357/45; 357/36; 357/15; 357/51; 357/71; 365/149; 365/154; 365/155; 365/175
[58] Field of Search ............... 365/148, 149, 175, 154, 365/155, 179, 188, 156; 357/71, 51, 45, 15, 36, 23.6, 23.15

[56] References Cited

U.S. PATENT DOCUMENTS

| 3,504,430 | 4/1970 | Kubo | 357/23.15 |
| 4,471,405 | 9/1984 | Howard et al. | 357/23.6 |
| 4,538,244 | 8/1985 | Sugo et al. | 365/155 |
| 4,566,026 | 1/1986 | Lee et al. | 357/71 |
| 4,636,833 | 1/1987 | Nishioka et al. | 357/23.6 |

FOREIGN PATENT DOCUMENTS

| 0081423 | 6/1983 | European Pat. Off. | 357/15 |
| 2341198 | 9/1977 | France | 357/15 |
| 53-43485 | 4/1978 | Japan | 357/15 |
| 58-53086 | 3/1983 | Japan | 365/155 |
| 59-149047 | 8/1984 | Japan | 357/51 |
| 59-171157 | 9/1984 | Japan | 357/15 |

OTHER PUBLICATIONS

Murarka, "Refractory Silicides . . . Circuits" *J. Vac. Sci. Technol.*, 17(4) Jul./Aug. 80, pp. 775–792.
*IBM TDB*, Zandler, "Dynamic Schottky Storage Cell" vol. 17, No. 11, 4/75, pp. 3215–3216.
*IBM TDB*, Beers et al., "Integrated Harper Cell" vol. 18, No. 9, Feb. 76, pp. 2875–2877.

*Primary Examiner*—Andrew J. James
*Assistant Examiner*—Jerome Jackson, Jr.
*Attorney, Agent, or Firm*—Antonelli, Terry & Wands

[57] ABSTRACT

A semiconductor memory device is provided such as the type having flip-flop memory cells each including two bipolar transistors in cross connection with each other. In certain embodiments, at least a part of a Schottky barrier diode or capacitor in the memory cell is formed under a digit line. This memory device is greatly reduced in its required area, and the Schottky barrier diode and capacitor are negligibly influenced by the digit line. In other embodiments, it is arranged to provide different electrodes for the Schottky barrier diode and the capacitor to optimize construction in a minimized space.

17 Claims, 13 Drawing Sheets

F I G. 1
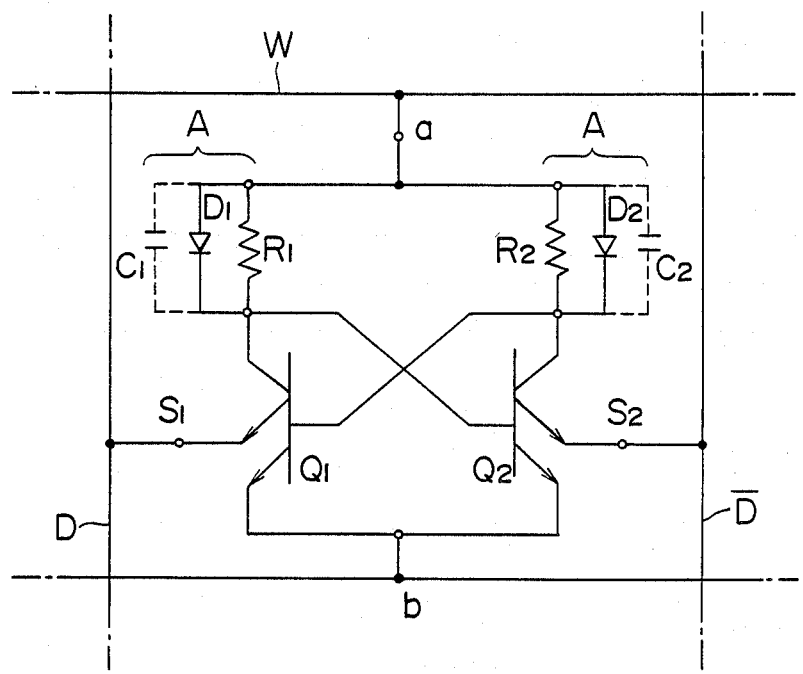

SEMICONDUCTOR MEMORY DEVICE

BACKGROUND OF THE INVENTION

This invention relates to a semiconductor device and more particularly to a semiconductor device suited to a high integration and high speed semiconductor memory LSI.

As a previously known memory cell, there has been proposed, in Japanese Patent Unexamined Publication No. 53-43,485, a high speed bipolar memory cell having such a circuit construction as shown in FIG. 1. This memory cell is characterized in that diodes $D_1$ and $D_2$ are provided in parallel with load resistors $R_1$ and $R_2$, respectively and the parasitic capacitances of $D_1$ and $D_2$ are employed as capacitors $C_1$ and $C_2$. Moreover, a and b connect the cell with word lines W for accessing the memory cell, and $S_1$ and $S_2$ connect the cell with digit lines D and $\overline{D}$ for reading out the memory contents. Such an arrangement provides the advantages: (1) high speed switching is possible, (2) operation allowance is increased, and (3) a soft error rate due to $\alpha$ rays is low.

To realize these advantages, the capacitors $C_1$ and $C_2$ are required to have electrostatic capacitances of approximately 500 fF, respectively. To this end, as mentioned above, the electrostatic capacitances of Schottky barrier diodes $D_1$ and $D_2$, for example are employed in place of those of the capacitors. The Schottky diodes in that memory cell uses an interface of a platinum silicide (PtSi) layer and a silicon layer. Such a diode, however, only gives a capacitance up to about 3.4 $fF/\mu m^2$ so that it occupies an area as large as 150 $\mu m^2$, which is about 30% of the entire memory cell area, so as to provide the required electrostatic capacitance. Tis is a serious obstacle when manufacturing a high speed bipolar memory with a high integration.

In view of these circumstance, in Japanese Patent Unexamined Publication No. 59-171,157, for example, the memory cell has been reduced in its area by means of the techniques of (1) independently forming capacitors $C_1$, $C_2$ and Schottky diodes $D_1$, $D_2$, (2) using, as dielectrics of capacitors $C_1$, $C_2$, tantalum oxide with a higher relative permittivity, etc. However, there is still an eager demand for further reducing the area of the memory cell.

SUMMARY OF THE INVENTION

An object of this invention is to provide a memory cell with a very small area so as to solve the problems attendant on the previously known techniques mentioned above.

To attain this object, in accordance with this invention, at least a part of diodes and/or capacitors that occupy the greater part of a memory cell are placed on the regions below signal lines (digit lines), previously not used, in such a condition that they are insulated from the signal lines, thereby reducing the entire area of the memory cell.

A more complete understanding of this invention can be attained by considering the following detailed description in conjunction with the accompanying drawings.

BRIEF DESCRIPTION OF THE DRAWINGS

FIG. 1 is a schematic of a bipolar memory device to which this invention is preferably adapted;

DESCRIPTION OF THE PREFERRED EMBODIMENTS

Embodiment 1

Figure 2:
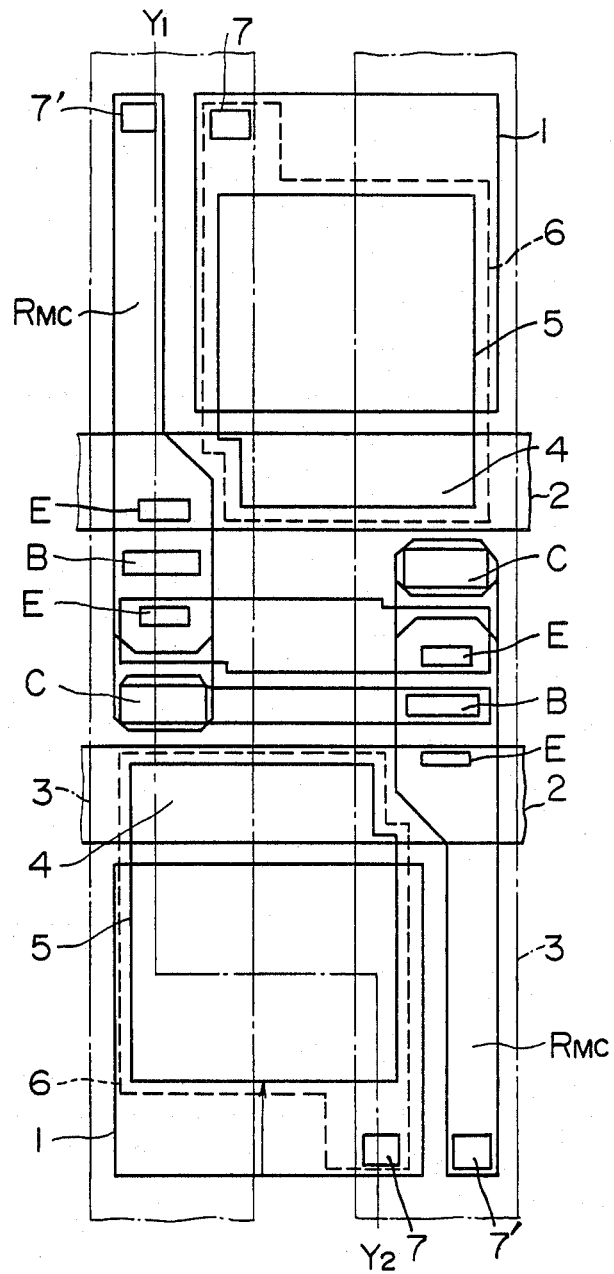
FIG. 2 is a schematic of an arrangement of elements of a bipolar memory device according to this invention and the prior art.

FIG. 2 shows a plan view of the memory cell in which platinum silicide (PtSi)/Si interface is employed as Schottky barrier diode (hereinafter referred to as SBD in its abridgement). In FIG. 2, numeral 1 denotes an SBD region in the previously known device, 2 denotes a signal line (digit line), 3 denotes a word line for accessing the memory cell, character B denotes a base region of a bipolar transistor, C denotes a collector region thereof, and E denotes an emitter region thereof. As seen from FIG. 2, in the previously known device, the greater part of the memory cell area is occupied by SBD 1.

On the other hand, in this invention SBD 5 is placed so as to partially run into a region 4 below digit line 2 so that the cell area required in the memory cell according to this invention is greatly reduced as compared with the case where SBD 1 does not overlap anywhere digit line 2 as in the previously known memory cell.

A region 6 encircled by a broken line, which is an anode of SBD 5, is electrically connected with word line 3 through a through-hole 7. In this invention, the anode 6 or upper electrode of SBD 5 should be electrically insulated from digit line 2.

Now referring to FIG. 3 that shows a section taken on line $Y_1-Y_2$ of FIG. 2, a memory cell according to one embodiment of this invention will be explained below in detail.

Figure 3:
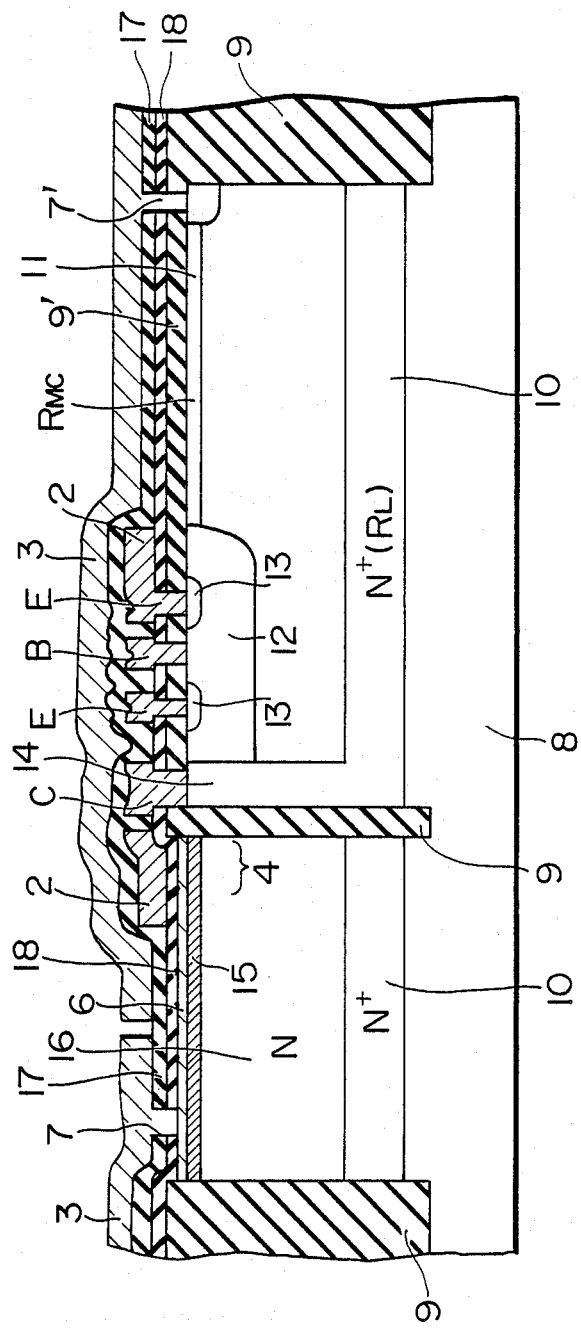
FIG. 3 is a sectional view taken on line $Y_1-Y_2$ of FIG. 2.

As seen from FIG. 3, insulating layers 9 each isolating elements from each other are provided on a Si substrate 8, and said transistor, a load resistor $R_{MC}$ and SBD 5 are provided in each of the areas isolated from each other by insulating layers 9. In FIG. 3, 10 denotes an N+ region providing a low resistance R, 11 denotes a high resistance region serving as a load resistor, 12 denotes a base area of the transistor, 13 denotes an emitter area thereof, 14 denotes a collector area thereof, and 15 denotes a platinum silicide (PtSi) layer, which forms a Schottky contact with a N-doped region 16. 6 denotes a Ti-W alloy film which constitutes an upper electrode of SBD 5, and 17 denotes an intermediate passivation film of e.g. phosphosilicate glass that insulates Ti-W alloy film 6 and digit line 2. The upper electrode 6 is electrically connected with word line 3 through through-hole 7. Since another passivation film 18 is placed between upper electrode 6 of SBD 5 and digit line 2, there is no fear of short-circuiting therebetween. Further, if passivation film 18 is thick, the signal propagation may be delayed because of some capacitance provided therebetween. However, it has been confirmed by the inventors of this invention that this delay is very small and negligible when passivation film 18 has a thickness greater than 2000 Å.

Further, as mentioned above, the upper electrode 6 of SBD 5 is electrically connected with word line 3 through through-hole 7 provided in intermediate insulating film 17.

In this way, in accordance with one embodiment of this invention, the addition of passivation film 18 and through-hole (contact hole) 7 to the previously known arrangement permits a Schottky barrier diode to run into the region 4 below digit line 2, thereby greatly reducing the entire area of the memory cell.

In this embodiment, as a Schottky junction, the PtSi/Si interface was used, but any interface formed by several kinds of silicide or metal, such as Pd$_2$Si/Si interface, AlPt/Si interface which can form a good Schottky interface may be used.

Embodiment 2

There has been proposed in e.g. Japanese Patent Unexamined Publication No. 59-149,047 another memory cell in which capacitors $C_1$, $C_2$ with smaller areas are provided in addition to Schottky barrier diodes $D_1$, $D_2$ so as to reduce the area of the memory cell. Thus, an explanation will be given for another embodiment in which these capacitors are partially placed also below digit lines to further reduce the area of the memory cell.

Figure 4:
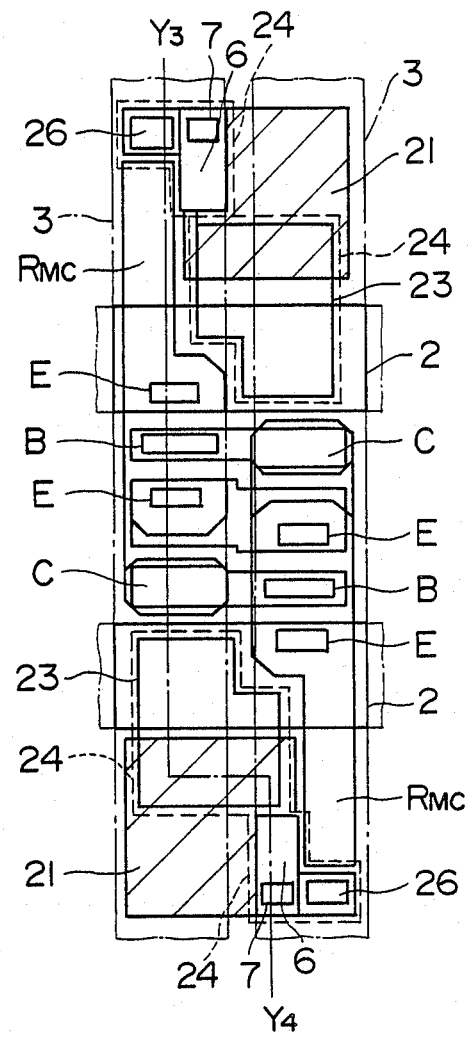
FIGS. 4 and 5 are a plan view of the memory device according to another embodiment of this invention and a sectional view taken on line $Y_3-Y_4$ of FIG. 4, respectively.

FIG. 4 shows a plan view of a memory cell with a reduced area in which an Ta$_2$O$_5$ film is used as a dielectric film of capacitors $C_1$, $C_2$ with smaller areas, of the memory cell as shown in FIG. 1. This memory cell is further reduced in its area as compared with the memory cell shown in FIG. 2 although the transistors are provided in the same arrangement as in FIG. 2. A hatched area 21 is a capacitor region of the prior art device. In accordance with this embodiment, each of capacitors is formed on a region 23 in such a way that a part thereof is inserted into an area below digit lines 2. Thus, the entire area of the memory cell is reduced. An anode 24 of the capacitor, encircled by a broken line serves as anode 6 of the SBD as well as an anode 26 of the load resistor and is connected with word line 3. Therefore, the advantage of this is further enhanced.

Figure 5:
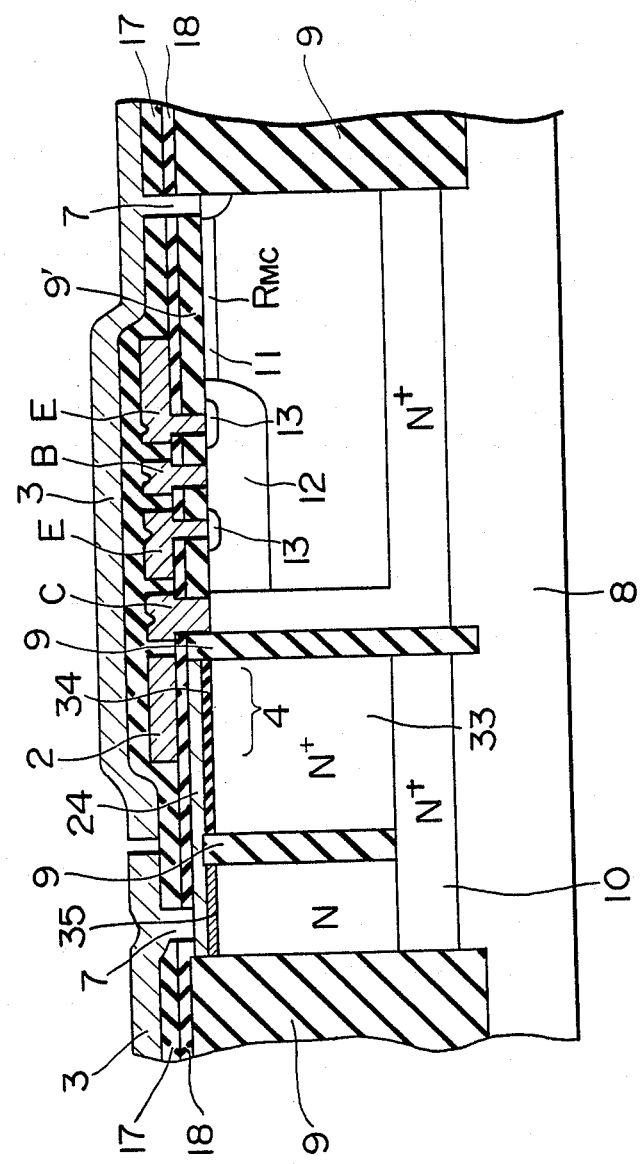

This embodiment will be further explained referring to FIG. 5 that shows section taken on line Y$_3$-Y$_4$ of FIG. 4. In FIG. 5, 8 denotes an Si substrate, 9 denotes an insulator film for isolation, 33 denotes an N+ doped layer serving as a lower electrode of the capacitor, 34 denotes a Ta$_2$O$_5$ thin film serving as a dielectric of the capacitor, 35 denotes a Pt-Al alloy or Pd$_2$Si layer that constitutes a small-area Schottky barrier diode, 24 denotes an anode of the capacitor and the SBD, made of e.g. a tungsten film, and 18 denotes a passivation film for insulating the anode 24 from digit line 2, made of a phosphosilicate glass film having a thickness of 2000 Å.

Anode 24 is connected with word line 3 through throughhole 7 provided in insulating film 17 and passivation film 18. Although in the prior art device, the capacitor was placed on the region other than the region where the digit line is placed, in accordance with this embodiment of this invention, the capacitor is placed to partially run into the region 4 so that the area of the memory cell can be greatly reduced.

Although the capacitor having a Ta$_2$O$_5$ film as a dielectric film was used in this embodiment, it is needless to say that a capacitor having a dielectric film of SiO$_2$, Si$_3$N$_4$, etc. and a groove type capacitor can also be used since this invention is characterized in that diodes or capacitors are placed on the regions below digit lines so as to reduce the memory cell area.

The reason why Pd$_2$Si or Pt-Al alloy was employed as electrode material of the diode in this embodiment is that it provides a junction barrier lower than the PtSi/Si junction ordinarily used so that it gives substantially the same diode characteristic as before even when its area is decreased.

In accordance with this invention, as explained in connection with Embodiments 1 and 2, SBD's or capacitors are placed to partially run into regions below digit lines, which have not been employed, so that the area of a memory cell can be greatly reduced.

Embodiment 3

A capacitor is provided by forming a refractory metal layer on the surface of a highly doped semiconductor region through an insulating film of transition metal oxide having a high permittivity, e.g. tantalum oxide (Ta$_2$O$_5$); this highly doped semiconductor region is provided together with a relatively lightly doped semiconductor region in a semiconductor region on a highly doped buried layer encircled by an isolation region. A Schottky barrier diode (SBD) is provided by forming a contact hole in an insulating film on the lightly doped semiconductor region, a metallic layer having a smaller barrier height $\phi_B$ on the inner wall thereof and a barrier electrode layer on the metallic layer. Such an arrangement of the capacitor and SBD can decrease its occupied area to implement a high integration density as compared with the case where the capacitor and diode are provided in different semiconductor regions, respectively. It can also greatly improve the frequency characteristic of the capacitor, the forward voltage characteristic of the diode, etc. so as to increase the read-out speed of the memory cell and improve its operation allowance thereof as well as to improve its heat resistivity and decrease its characteristic unevenness, as compared with the case where the capacitor and diode having the same structure (or material) of electrode are provided on the semiconductor region having the same impurity concentration.

Figure 6:
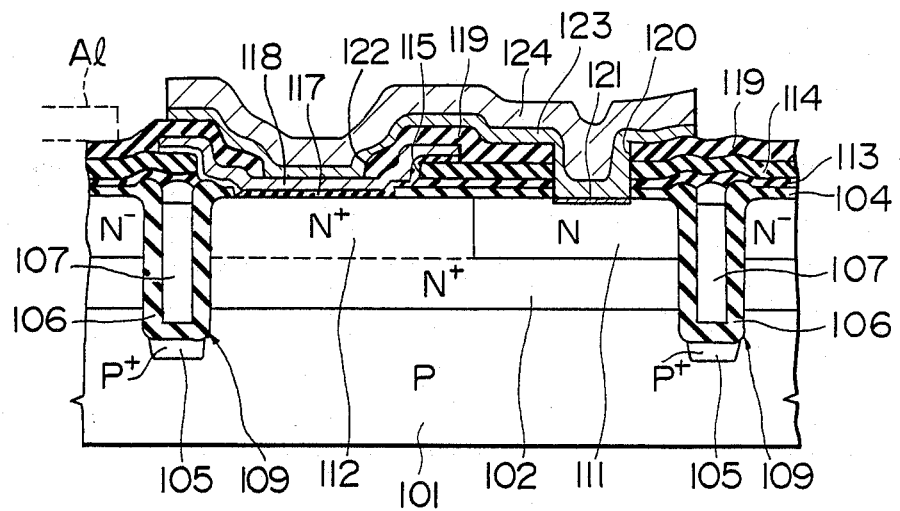
FIG. 6 is a sectional view of the memory device according to still another embodiment of this invention.

FIG. 6 shows one embodiment when this invention is applied to fabricate a SBD and capacitor connected in parallel with load resistors in an emitter coupled type memory cell.

In FIG. 6, a highly doped N+ buried layer 102, encircled by an isolation region 109 such as a trench isolation region in its periphery, is formed in a semiconductor substrate 101 of e.g. P single crystal Si. A lightly doped N semiconductor region 111 and a highly doped N+ semiconductor region 112 are formed on N+ buried layer 102.

An opening or contact hole 115 is formed in insulating films 113 and 114 provided on the surface of semiconductor substrate 101 at the position corresponding to highly doped N+ semiconductor region 112. An electrode layer 118 of refractory metal, e.g. tungsten W, molybdenum Mo, etc. or its silicide, e.g. WSi, MoSi, etc. is formed on the inner wall and periphery of opening 115 through an insulating film 117 having a high permittivity, of transition metal oxide, e.g. tantalum oxide $Ta_2O_5$. Thus, a capacitor having a large electrostatic capacitance per a unit area is formed between electrode layer 118 and N+ semiconductor region 112.

On the other hand, a relatively small contact hole 120 is formed in insulating films 104, 113 and 114 provided on the surface of lightly doped N semiconductor region 111 on N+ buried layer 102, and an electrode layer 121 of metal silicide having a smaller barrier height $\phi_B$, e.g. PtSi, $Pd_2Si$, etc. is formed on the surface of lightly doped N semiconductor region 111 inside the contact hole 120 by heat-treating the metal such as Pt and Pd evaporated on the surface.

Moreover, an insulating film 119 of e.g. a PSG (phospho silicate glass) film is formed on electrode layer 118 (on insulating film 114 outside the electrode layer 118) at the capacitor side, and an opening 122 is formed in the insulating film 119 in correspondence to said electrode layers 118 and 121. A barrier electrode layer 123 of a metal compound containing Ti, e.g. TiW, TiN, TiS, etc. is formed in contact with the electrode layer 121 inside the contact hole so as to form a Schottky barrier diode. This barrier electrode layer 123 is extended over the capacitor and is in contact with the electrode layer 118 of the capacitor at the opening 122. An aluminum layer 124 is formed on barrier electrode layer 123, and the anode of the SBD and one electrode of the capacitor are connected with each other by means of barrier electrode layer 123 and aluminum layer 124.

In this embodiment, the capacitor and SBD that have electrode structures different from each other are formed on the common N+ buried layer 102 encircled by trench isolation region 9. This permits the memory cell to be enhanced in its integration degree by the extent of the isolation region as compared with the case where the capacitor and SBD are formed in different regions. Further, since the capacitor and SBD have different electrode structures, such an electrode as can improve the heat resistance can be used for the capacitor and for the SBD, such an electrode material as gives the most suitable current-voltage characteristic for the memory cell can be used. Therefore, the capacitor and SBD can be improved in their characteristic independently from each other unlike the case where they have the same structure of electrode. Thus, the problem does not occur that when the characteristic of one element is improved, that of the other element is deteriorated, as is often the case with the prior art device.

Furthermore, in this embodiment, the impurity concentration of semiconductor region 112 that constitutes the capacitor is made greater than that of semiconductor region 111. This permits the desired forward voltage $V_F$ to be provided at the diode section because of the low impurity concentration of semiconductor region 111, and permits, at the capacitor section, the value of the resistor connected in series with the capacitor to be made smaller because of the high impurity concentration of semiconductor region 112, thereby improving the high frequency characteristic of the capacitor.

Further, in this embodiment, semiconductor region 112 constituting the capacitor and semiconductor region 111 are in contact with N+ buried layer 102 at their lower end. This permits the parallel connection of the capacitor and diode to be easily carried out. Further, if this N+ buried layer 102 is made integral with the N+ buried layer serving as a collector area of the multi-emitter transistor $Q_1$ (or $Q_2$) as shown in FIG. 1, the wiring resistance for connecting the transistor $Q_1$ (or $Q_2$) with the capacitor $C_1$ (or $C_2$) and diode $D_1$ (or $D_2$) can be decreased.

Further, in this embodiment, refractory metal used as electrode 118 of the capacitor protects, because of its excellent heat resistance, the very thin insulating film 117 from heat applied during the fabrication process so that the former does not react with the latter. In the case where tungsten is used as electrode layer 118 and tantalum oxide is used as insulating layer 117, electrode 118 is not likely to be short-circuited to the lower semiconductor region 112 since tungsten is hard to react with tantalum oxide.

Further, in this embodiment, contact hole 120 for the diode is provided at a position apart from the end or bird's beak of trench isolation 109. Therefore, the integration degree of the inventive memory cell may be decreased by the extent of mask alignment as compared with the case where this contact hole is formed in a self-aligned manner using the bird's beak of the isolation region. However, this contact hole, i.e. an opening in the insulating film on the substrate surface can be formed in a very small area using a dry etching technique.

On the other hand, when the contact hole is formed through a wet etching technique using the bird's beak, the area of the contact hole will be greatly varied depending on the wet etching condition. And since the bird's beak itself will be varied in its growth degree depending on its fabrication process condition, the area of the contact hole will be eventually varied when it is formed using the bird's beak.

Meanwhile, the forward voltage $V_F$ of SBD is varied depending on its area. Therefore, it will be varied due to the fluctuation of the fabrication process condition when the area of SBD, i.e. that of the contact hole is decreased. Accordingly, the provision of the contact hole using the bird's beak does not permit the diode area to be greatly reduced.

On the other hand, if the contact hole 120 is provided apart from the bird's beak as in this embodiment, the area of contact hole 120, i.e. $V_F$ is not so varied because of the fabrication process condition.

According to the findings by the inventors of this invention, if the metal kept in contact with the surface of the semiconductor region 111 constituting the SBD has a smaller $\phi_B$, the desired forward voltage $V_F$ required for operating the memory cell is provided even when the area of contact hole 120 is fairly decreased. In this embodiment, therefore, as electrode layer 121 on the surface of semiconductor layer 111, platinum silicide (PtSi) and palladium silicide ($Pd_2Si$) having a $\phi_B$ less than 0.9 eV are used to decrease the area of contact hole 120.

Thus, if the small contact hole 120 is formed using the dry etching technique, the integration density is not decreased as compared with the case where the contact hole is formed using the bird's beak, but rather can be increased. Moreover, since the unevenness relative to the area of the contact hole 120 during to the fabrication processing is greatly decreased, that of $V_F$ of SBD is decreased.

Furthermore, in this embodiment, the barrier electrode 123 of SBD is extended over the capacitor section (112) so that it is not readily peeled from insulating film 119. More specifically, although the connection of electrode layer 118 of the capacitor and barrier electrode 123 of SBD can be made by extending barrier electrode 123, it can also be made by extending electrode layer 118 over the diode so as to make contact with the barrier electrode, or by directly connecting them through the upward aluminum layer 124. However, since it is known that the metallic or semiconductor layer containing Ti, such as TiW, easily sticks to the insulating film such as the PSG film, the connection of electrodes 123 and 118 by the extension of barrier electrode 123 over the capacitor is the best method for preventing the connection wiring layer from being peeled from insulating film 119.

Incidentally, it is possible to use the barrier electrode 123 extended over the capacitor section as an electrode for the capacitor. This method, however, is inferior to this embodiment in which refractory metal such as W is used as an electrode of the capacitor, from the viewpoints of the heat resistance and protection of the insulating layer (tantalum oxide layer) 117 serving as a dielectric.

Further, in this embodiment, barrier electrode 123 extended from the diode section is in contact with electrode layer 118 through contact hole 122 provided in the insulating film 119, such as a PSG film, formed on electrode layer 118. This prevents the production yield from being decreased caused by wiring short-circuit even if the very high integration density is sought by lowering allowance of mask alignment in wiring production.

More specifically, if the aluminium wiring production mask does not have sufficient alignment allowance assuming that insulating film 119 is not provided on electrode layer 118, the distance between electrode layer 118 and the adjacent aluminium wiring may be made small because of error of mask alignment in patterning the aluminium wiring, as shown by a broken line in FIG. 6, thereby causing some short-circuiting therebetween. In contrast, in this embodiment, insulating film 119 is placed on electrode layer 118 of the capacitor so that some mask slippage, as long as the distance among the aluminium wirings is kept at a minimum dimension permitted in the fabrication process, does not result in the short-circuiting among the wiring layers because of the separation of the aluminum wiring layer and electrode layer 118 of the capacitor.

A process for fabricating the capacitor and diode as shown in FIG. 6 will be explained with reference to FIGS. 7a to 7e.

First, N impurities are selectively introduced in the surface of semiconductor substrate 101 of P-single crystal silicon using a silicon oxide film or the like as a mask so as to form N+ buried layer 102. An N− epitaxial layer is formed on N+ buried layer 102 through a vapor phase growth technique, and thermally oxidized to form a silicon oxide 104. A silicon nitride film is deposited on silicon oxide film 104 through a CVD technique or the like. A groove that extends through N+ buried layer 102 to reach the surface of semiconductor substrate 101 is formed at the position corresponding to the boundary among the cells (the periphery of the capacitor and diode) through an anisotropical dry etching technique or the like, using the above silicon nitride film. P impurities are introduced into the bottom of the groove through an ion implantation technique so as to form a channel stopper layer 105.

Figure 7A:
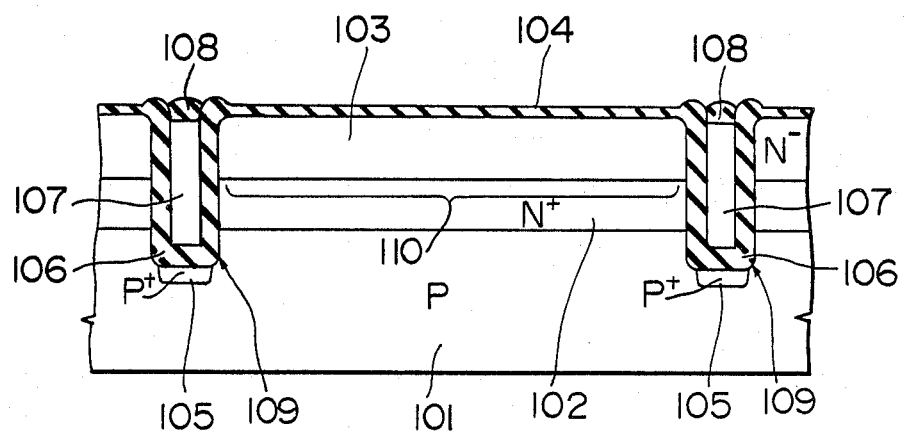
FIGS. 7a to 7e and FIG. 8 are flow diagrams for explaining the method for fabricating the memory device of FIG. 6 by the device sections in respective steps and a plan view of the resultant device.

Thereafter, thermal oxidation is carried out to form a silicon oxide on the inner wall of the groove, and a silicon nitride film or the like is deposited on the silicon dioxide film to eventually form an insulating film 106 in the groove. Polysilicon is deposited on the entire surface of semiconductor substrate 101 and is etched back to leave the polysilicon in the groove inside the insulating film. Thermal oxidation is carried out to provide a cap of a silicon oxide 108 to the surface of polysilicon 107. Thereafter, eliminating the silicon nitride film mask gives a cell production region 110 isolated by a trench isolation region 109, as shown in FIG. 7a.

Figure 7B:
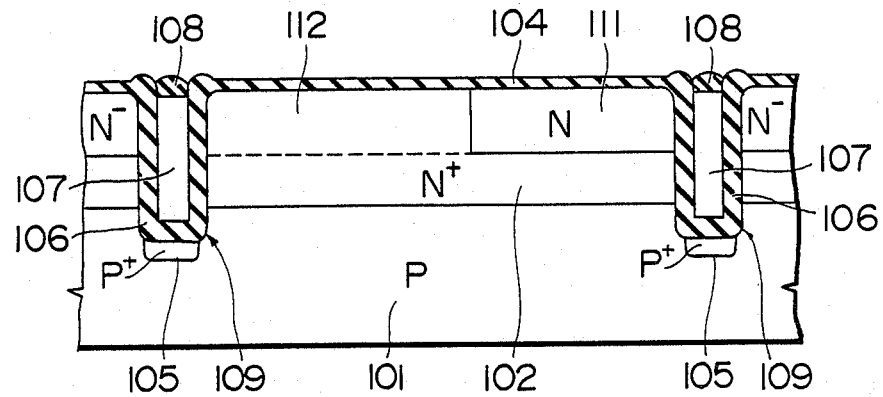
Figure 7C:
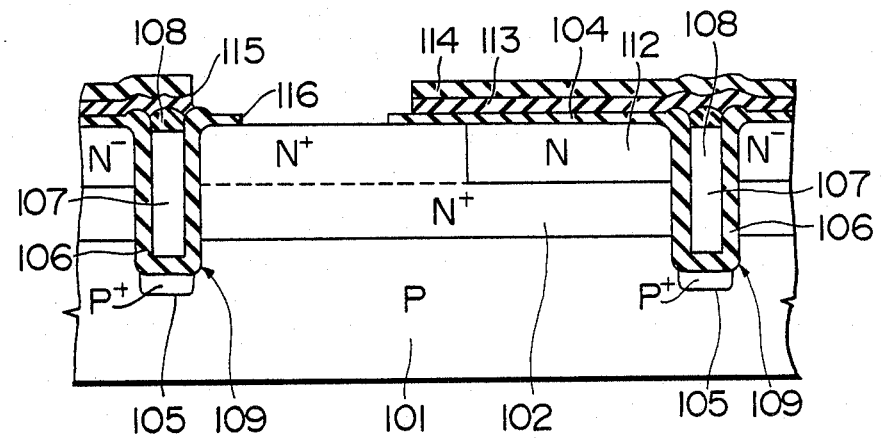

Next, N impurities are introduced into epitaxial layer 103 at its part where the capacitor is to be formed, through the ion implantation technique using a silicon nitride film or the like as a mask so as to form such a highly doped N+ semiconductor layer as to reach N+ buried layer 102. Thereafter, N impurities are introduced into epitaxial layer 103 at its part where the SBD is to be formed, through the ion implantation technique using a photoresist coating or the like as a mask so as to form a relatively lightly doped N semiconductor region 111. Thus, such a state as shown in FIG. 7b results. Although N semiconductor region 111 is illustrated to reach N+ buried layer 102, it is not forced to reach there.

Figure 9:
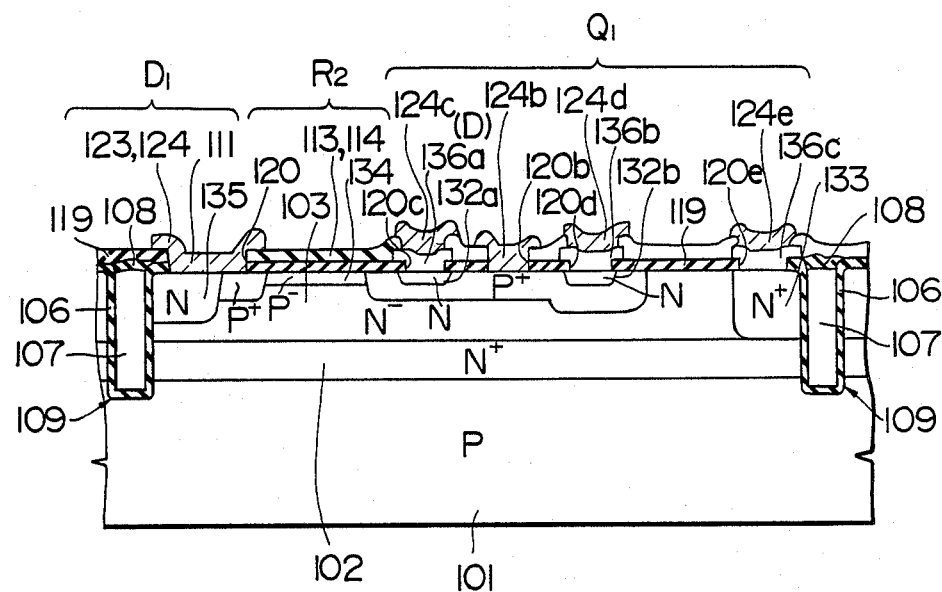
FIG. 9 is a sectional view of the memory device according to yet another embodiment of this invention.

The above N+ semiconductor region 112 can be formed simultaneously with an N+ Semiconductor region 133 serving as a collector extraction region of a transistor $Q_1$ as shown in FIG. 9. This simplifies the fabrication process.

Incidentally, although in this embodiment, N semiconductor region 111 for constituting the diode was formed after N+ semiconductor region 112 for constituting the capacitor, the former may be formed after the latter. The N− epitaxial layer 103 may be used as N semiconductor region 111 as it is.

In such a state as shown in FIG. 7b, a silicon nitride film 113 and a PSG film are successively deposited on the entire substrate surface through the CVD technique. An opening or contact hole corresponding to N+ semiconductor region 112 is formed in PSG film 114 and silicon nitride film 113 through the dry etching. Thermal oxidation is carried out to restore the damage of silicon oxide film 104 exposed inside the opening 115, given by the above etching; the opening 115 may be formed through wet etching, and in this case the thermal oxidation is not necessarily required. Thereafter, an opening 116 that is slightly smaller than opening 115 is formed in silicon oxide film 104 inside the opening 115. Thus, such a state as shown in FIG. 7 results.

Figure 7D:
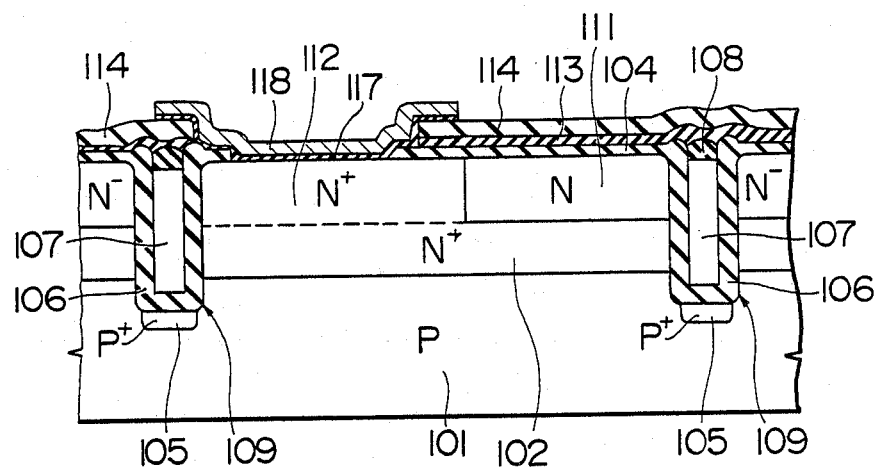

After having performed preparatory treatment, an insulating film 117, such as tantalum oxide, having a thickness of 75 Å is deposited on the resultant substrate surface. When this insulating film 117 is heat-treated, pin-holes produced in the very thin insulating film 117 on the surface of N+ semiconductor region 112 are filled with a thermal oxidation film. Electrode layer 118 of refractory metal, e.g. W is deposited on the entire resultant surface, and the electrode layer (W layer) and the insulating film ($Ta_2O_5$ film) thereunder are selectively eliminated to leave them on only the surface of N+ semiconductor region 112 and its periphery. Thus, such a state as shown in FIG. 7d results.

Thereafter, an intermediate insulating film 119 such as a PSG film is deposited on the entire substrate surface through CVD, and is densified through heat treatment. A contact hole 120 is provided, on the surface of N semiconductor region 111 for SBD, in insulating film 119, PSG film 114, silicon nitride film 113 and silicon dioxide film 104. This contact hole 120 can be formed simultaneously with contact holes 120b to 120e for base, emitter and collector areas of the transistor shown in FIG. 9.

Figure 7E:
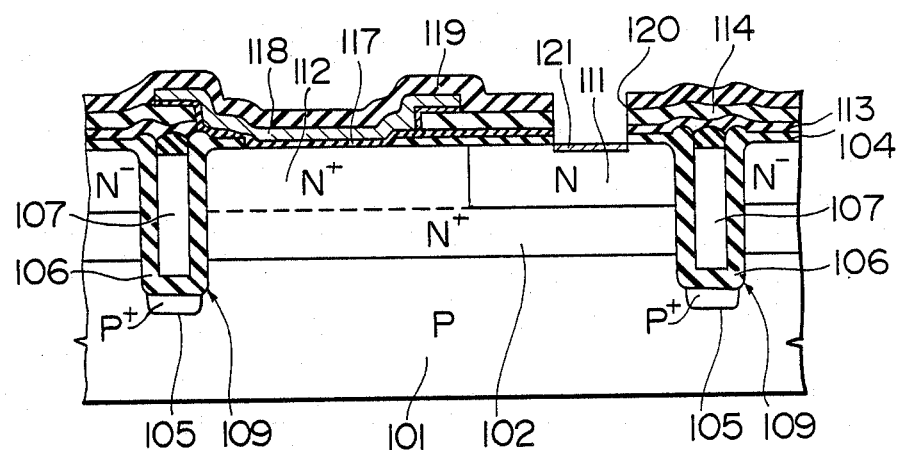

Palladium (or platinum) is formed by using vacuum-evaporation technique on the entire surface of the substrate. Thereafter, if the evaporated palladium is heat-treated for ten minutes at 250° C., only the palladium on the surface of N semiconductor region 111 inside contact hole 120 reacts with silicon thereby to form a thin electrode layer 121 of palladium silicide ($Pd_2Si$) Subsequent wet etching removes the non-reacted palladium other than the electrode layer 121, resulting in such a state as shown in FIG. 7e.

Insulating film (PSG film) 119 is selectively removed through dry etching so as to form an opening 122 corresponding to electrode layer (W layer) 118 of the capacitor section. A TiW layer 123 and aluminum layer 124 are deposited on the entire substrate surface. Thereafter, Al layer 124 and TiW layer 124 therebelow are simultaneously patterned through dry etching so as to form a wiring layer, resulting in such a state as shown in FIG. 6.

Thereafter, an intermediate insulating film, such as a silicon nitride film or silicon oxide film made by plasma CVD, is formed on Al layer 124 and a secondary Al layer is deposited on the intermediate insulating film. Patterning is carried out and finally a passivation film is formed, thus completing the inventive memory cell.

In the process mentioned above, after electrode layer (W layer) 118 of refractory metal is formed on thin insulating layer ($Ta_2O_5$ layer) 117 on the surface of N+ semiconductor region for the capacitor, contact hole 120 is formed on the surface of N semiconductor region 111 for the diode to subsequently form electrode layer ($Pd_2Si$ layer) 121. Therefore, insulating film ($Ta_2O_5$ film) is not injured by etching liquid or gas used when contact hole 120 is formed. Electrode layer (W layer) 118 serves to protect thin insulating film ($Ta_2O_5$ layer) 117 from heat applied when palladium evaporated on the N semiconductor region 111 surface is heat-treated to form electrode layer ($Pd_2Si$ layer) 121. Thus, the heat resistance at the capacitor section is improved and so the short-circuiting between electrode layer (W layer) 118 and N+ semiconductor region 121 will scarcely occur.

Moreover, in the process mentioned above, opening 122 is formed in insulating film (PSG film) 119 on electrode layer (W layer) 118 of the capacitor, and through this opening, electrode layer (TiW layer) 121 extended from the diode section is made contact with electrode layer 118 of the capacitor. Therefore, with less alignment allowance of the wiring production masks, short-circuiting between electrode layer (W layer) 118 and the Al wiring layer adjacent thereto is prevented, improving the production yield.

Further, in the process mentioned above, contact hole 120 is formed through dry etching so that its area can be made very small. Therefore, even if contact hole 120 is formed apart from the end or bird's beak of the isolation, the area occupied by the diode is not increased. The characteristic of the diode is not varied because of the contact hole area being fixed as compared with the case where the contact hole is formed using the bird's beak of the isolation region.

Figure 8:
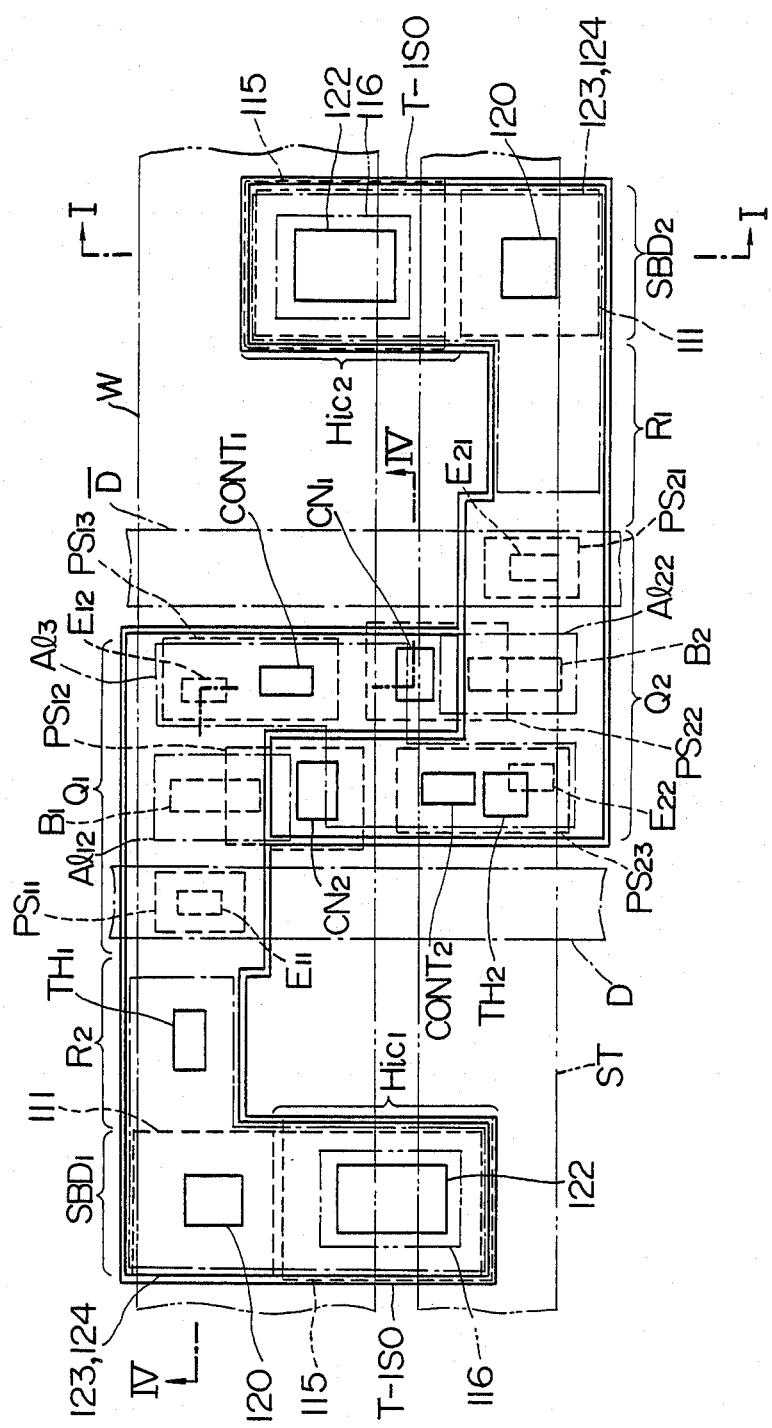

Referring to FIG. 8, an explanation will be given for a memory cell layout when the diode and capacitor constructed as mentioned above are applied to the emitter coupled memory cell as shown in FIG. 1.

A memory line in the direction of a word line is constructed by arranging a plurality of memory cells of inverted "S" shapes in accordance with the layout as shown in FIG. 8 in such a manner that a memory cell is intimately engaged with the adjacent memory cell in the horizontal direction. A plurality of such memory lines are arranged in the vertical direction so as to construct a matrix shape of memory array.

In FIG. 8, symbols $SBD_1$ and $SBD_2$ denote regions where Schottky barrier diodes $D_1$ and $D_2$ are to be formed, respectively, and regions Hi $C_1$ and Hi $C_2$ where capacitors $C_1$ and $C_2$ are to be formed, respectively, are located adjacently to $SBD_1$ and $SBD_2$. Regions $R_2$ and $R_1$ where resistors $r_2$ and $r_1$ are to be formed, respectively, are located integrally with the respective one sides of $SBD_1$ and $SBD_2$. $SBD_1$ ($SBD_2$), Hi $C_1$ (Hi $C_2$) and $R_2$ ($R_1$) are arranged so as to form a "L" shape as a whole.

Barrier electrode 123 and first Al layer 124 extended from $SBD_1$ ($SBD_2$) to Hi $C_1$ (Hi $C_2$) are also extended over $R_2$ ($R_1$) Thereby, the electrode of capacitor C ($C_2$) is connected with the anode terminal of Schottky barrier diode $D_1$ ($D_2$) and one terminal of resistor $r_2$ ($r_1$).

Substantially "L" shape regions $Q_1$ and $Q_2$ where transistors are to be formed are placed integrally with $R_2$ and $R_1$, respectively. At the boundary portions between $Q_1$, $Q_2$ and $R_2$, $R_1$, or one ends of $Q_1$ and $Q_2$, one emitter areas $E_{11}$ and $E_{21}$ that are connected with data line D and $\overline{D}$ are formed through polysilicon layers $PS_{11}$ and $PS_{21}$, respectively. Data lines D and $\overline{D}$ are formed with the first Al layers 124.

Collector extraction areas $CN_1$ and $CN_2$ are located at the other ends of $Q_1$ and $Q_2$, respectively and base contact holes $B_2$ and $B_1$ are located in $Q_2$ and $Q_1$ adjacent to $CN_1$ and $CN_2$, respectively. $CN_1$ and $CN_2$ are not particularly limited except that $CN_1$ and $CN_2$ are connected, through polysilicon layers $PS_{22}$ and $PS_{12}$, with base extraction electrodes $Al_{22}$ and $Al_{12}$ formed on base contact holes $B_2$ and $B_1$, respectively. Thus, transistor $Q_1$ and $Q_2$ are in contact with each other so that the base and collector of one transistor are connected with the collector and base of the other transistor, respectively. Base extraction electrodes $Al_{12}$ and $Al_{22}$ are formed with the first Al layers 124.

Further, a second emitter area $E_{12}$ ($E_{22}$) is located between collector extraction region $CN_1$ ($CN_2$) and base contact hole $B_1$ ($B_2$). Polysilicon layers $PS_{13}$ and $PS_{23}$ are formed on the second emitter areas $E_{12}$ and $E_{22}$, respectively. Polysilicon layers $PS_{13}$ and $PS_{23}$ are connected with each other through the first Al layer $Al_3$. $CONT_1$ and $CONT_2$ are contact holes between the Al layer $Al_3$ and polysilicon layers $PS_{13}$, $PS_{23}$.

A word line W of the second Al layer and a standby line ST through which a standby current is passed are arranged in parallel to each other over the memory cell constructed in accordance with said layout so that they lie at right angles to data lines D and $\overline{D}$.

Word line W is connected with Al layer $Al_{11}$ ($Al_{21}$) serving as the anode terminal of Schottky barrier diode $D_1$ ($D_2$) through a through-hole $TH_1$. Al layer $Al_{21}$ is connected with word line W in such a way that it is formed integrally to Schottky barrier diode $D_1$ in the adjacent memory cell.

Stanby line ST makes contact with common connection Al layer $Al_3$ of the second emitters $E_{12}$ and $E_{22}$ through a through-hole $TH_2$, and the stanby current flows through emitters $E_{12}$ and $E_{22}$.

A trench isolation region T-ISO for element isolation is formed at the periphery of said memory cell and the boundary between the symmetrical elements. That is, the elements $Q_1$, $C_1$, $D_1$, $R_1$ and the elements $Q_2$, $C_2$, $D_2$, $R_2$ in FIG. 1 are isolated from each other by trench isolation region T-ISO. Incidentally, FIG. 6 shows a section taken on line I—I of FIG. 8.

FIG. 9 is a sectional structure taken on line IV—IV of FIG. 8.

In FIG. 9, 131 is a P+ semiconductor region serving as a base area of transistor $Q_1$ ($Q_2$) in the memory cell shown in FIG. 1; 132a and 132b are N+ semiconductor regions serving as emitter area of transistor $Q_1$ ($Q_2$); and 133 is an N+ semiconductor region serving as a collector extraction region of transistor $Q_1$ ($Q_2$).

In this embodiment, $h_{FE}$ (common-emitter static forward current transfer ratio or dc current amplification) of $Q_1$ ($Q_2$) is adjusted to be an optimum value by varying the thickness of the base area just below emitter areas 132a and 132b, although this can be also carried out by any other suitable methods.

N semiconductor region 111 constituting SBD $D_1$ ($D_2$) is formed over N+ buried layer 102 serving as the collector area of transistor $Q_1$ ($Q_2$), and a shallow P− semiconductor region 134 serving as load resistor $R_2$ ($R_1$) is formed between this N semiconductor region 111 and base area 131. A P+ semiconductor region 135 is formed at the boundary between P− semiconductor region 134 and N semiconductor region in order to reduce contact resistance with the Al electrode layer 124.

Contact hole 120 is formed in insulating films 113, 114 and 119 on the surfaces of N semiconductor region 111 for the diode $D_1$ ($D_2$) and P+ semiconductor region 135 serving as one terminal of load resistor $R_2$, and is filled with barrier electrode 123 of $D_1$ and Al electrode layer 124 so as to make connection of the anode terminal of $D_1$ ($D_2$) with the one terminal of resistor $R_2$ ($R_1$). A contact hole 120b formed in insulating films 113 and 114 on the surface of base area 131 is filled with Al electrode layer 124b serving as a base extraction electrode.

Contact holes 120c to 120e corresponding to emitter areas 132a, 132b and collector extraction region 133, formed in insulating films 113 and 114 on the substrate surface, are filled with polysilicon electrodes 136a to 136c on which Al electrode layers 124c to 124e are formed through insulating film 119.

The semiconductor device in accordance with this embodiment of the invention has the following main advantages.

(1) Since a capacitor and diode having at least different electrode structures are formed in the same semiconductor region in one principal surface of a semiconductor substrate, so as to provide individual desired characteristics for them, the memory cell having capacitors and diodes will be improved in its operation speed and operation allowance degree. The integration density will not also be degraded.

(2) Since a capacitor and a diode having at least different electrode structures are formed, with the region where the capacitor is to be formed being more highly doped than the region where the diode is to be formed, in the same semiconductor region in one principal surface of a semiconductor substrate so as to decrease the value of a resistor connected in series with the capacitor, the capacitor will be improved in its high frequency characteristic and so a high operation speed memory cell can be provided.

(3) Since a diode region and capacitor region are connected with each other in their lower part through a highly doped buried layer that is connected with a highly doped buried layer serving as a collector area of a vertical type bipolar transistor, so as to decrease the resistance of a connection wiring between the diode and capacitor, and the transistor, a high operation speed memory cell can be obtained.

(4) Since a capacitor and a diode having at least different electrode structures are formed, with an electrode layer of refractory metal being formed on the surface of a capacitor region through an insulating film of an oxide of transition metal in the same semiconductor region in one principal surface of a semiconductor substrate, so as to protect the insulating film serving as a dielectric by the refractory metal, the memory cell will be improved in its heat resistance and so in its production yield.

(5) Since a capacitor and a diode having at least different electrode structures are formed in the same semiconductor region in one principal surface of a semiconductor substrate, with a contact hole being formed on the surface of the diode region at a position apart from an end of a circumferential isolation region, an electrode layer of metal silicide having $\phi_B$ less than 0.9 eV being formed on the semiconductor substrate surface inside the contact hole and a barrier electrode layer being formed thereon, so as to provide the diode with a small area and less unevenness of its characteristic, the memory cell will be improved in its integration density and reliability.

(6) Since a capacitor and a diode having at least different electrode structures are formed in the same semiconductor region in one principal surface of a semiconductor substrate, with the barrier electrode of the diode being made of conductive material containing titanium and extended over the capacitor region to make contact with the electrode layer of the capacitor, so as to provide a wiring layer for connecting the diode and the capacitor, not readily peeled off, the memory cell will be improved in its production yield and reliability.

(7) Since a capacitor and a diode having at least different electrode structures are formed in the same semiconductor region in one principal surface of a semiconductor substrate, with an insulating film being formed on the electrode layer of refractory metal of the capacitor, and a barrier electrode of the diode being extended to make contact with the capacitor electrode through an opening formed in the insulating film, so as to prevent short-circuiting between the capacitor electrode and an Al wiring layer even with less alignment allowance of masks for forming the wiring layer, the memory cell will be enhanced in its integration density and improved in its production yield.

Having thus described this invention using the embodiment thereof, it will be apparent to those skilled in the art that various modifications can be made within the spirit and scope of this invention. For example, although in the embodiment mentioned above, explanation has been given for the case where this invention is applied to the fabrication of a Schottky barrier diode and a capacitor in an emitter coupled memory cell as shown in FIG. 1, this invention is not limited to such a memory cell. Namely, it has been proposed to connect one capacitor $C_0$ between the collector terminals (or base terminals) of two transistors $Q_1$ and $Q_2$ so as to provide the same effect as the case where capacitors $C_1$ and $C_2$ are connected in parallel to Schottky barrier diodes $D_1$ and $D_2$ as shown in FIG. 1. This invention can be applied to the fabrication of capacitor $C_0$ and Schottky barrier diode $D_1$ and $D_2$ in the memory cell as shown in FIG. 6.

Figure 10:
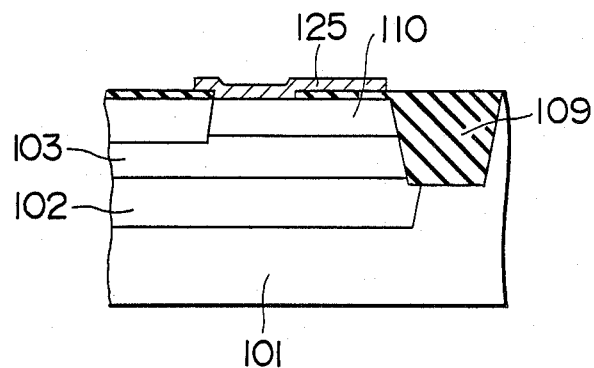
FIG. 10 is a sectional view for explaining the problems attendant on the prior art memory device.

This invention can be generally applied to a semiconductor integrated circuit having diodes and capacitors although the above explanation has been mainly given for the application to the Schottky barrier diodes and capacitors at a load resistor side in an emitter coupled memory cell that is a background utilization field of this invention. For example, it has been proposed in Japanese Patent Unexamined Publication No. 59-149047 as seen from FIG. 10 that a Schottky barrier diode is formed by bringing an anode 125 into contact with one side surface of a common semiconductor region 110, and a capacitor is formed by extending the anode electrode 125 onto an insulating film 117 of transition metal oxide, formed on the other side surface of the common semiconductor region 110. In such a method for forming the Schottky diode and capacitor on the common semiconductor region 110, it must be lightly doped in order to provide the Schottky barrier diode having a desired forward voltage $V_F$. If the semiconductor region 110 is lightly doped, the read-out speed is made lower since a resistor component is inserted in series with the capacitor at the capacitor section. On the other hand, if the semiconductor region 110 is highly doped to reduce the value of the resistor component inserted in series with the capacitor, the desired forward voltage cannot be obtained at the Schottky barrier diode section.

In accordance with the embodiment of this invention mentioned above, the above problems attendant on the prior art can be effectively solved. Embodiment 4

A capacitor is provided by forming a refractory metal layer on the surface of a highly doped semiconductor region through an insulating film of transition metal oxide having high permittivity, e.g. tantalum oxide ($Ta_2O_5$); this highly doped semiconductor region and a lightly doped semiconductor region, which are isolated from each other by a relatively shallow isolation region, are formed in a semiconductor region on a highly doped buried layer encircled by a relatively deep isolation region. A Schottky barrier diode (SBD) is provided by forming an electrode layer of ternary alloy having a smaller barrier height $\phi_B$ on the surface of the lightly doped semiconductor region. Such an arrangement of the capacitor and SBD can decrease its occupied area to implement a high integration degree as compared with the case where the capacitor and diode are provided in different semiconductor regions, respectively. It can also greatly improve the frequency characteristic of the capacitor, the forward voltage characteristic of the diode, etc. so as to increase the read-out speed of the memory cell and improve the operation allowance thereof, as compared with the case where the capacitor and diode having the same structure (or material) of the electrode are provided on the same impurity concentration region. The adoption of the ternary alloy in place of binary alloy as the electrode of SBD can eliminate the necessity of inserting a barrier electrode layer between the upper Al wiring layer and the lightly doped semiconductor region.

Figure 11:
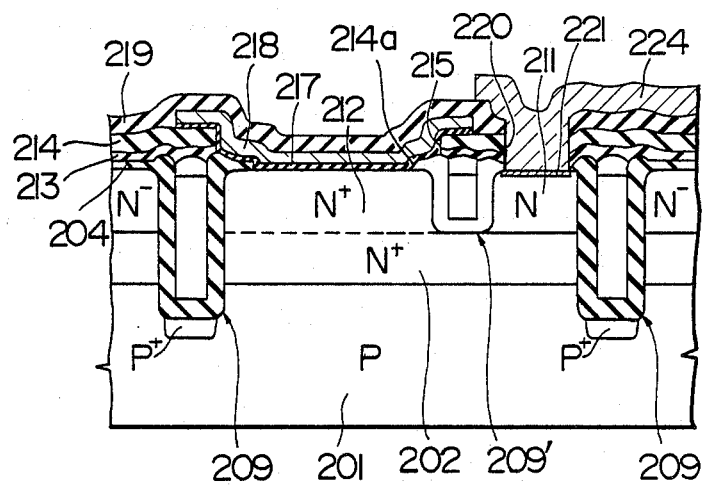
FIG. 11 is a sectional view of the memory device according to a further embodiment of this invention.

FIG. 11 shows one embodiment when this invention is applied to fabricate a SBD and capacitor connected in parallel with load resistors in an emitter coupled type memory cell.

In FIG. 11, a highly doped N+ buried layer 202, encircled by an isolation region 209 such as a trench isolation region in its periphery, is formed in a semiconductor substrate 201 of e.g. P single crystal Si. A lightly doped N semiconductor region 211 and a highly doped N+ semiconductor region 212 are formed on N+ buried layer 202 and are isolated by a shallow trench isolation region 209 which are formed therebetween with such a depth as to make contact with N+ buried layer 202.

An opening or contact hole 214a is formed in a silicon oxide film 204 provided on the surface of semiconductor substrate 201 and an opening or contact hole 215 is formed in insulating films 213 and 214 provided on the silicon oxide film 204; these openings are placed at the position corresponding to highly doped N+ semiconductor region 212. An insulating film 217 having a high permittivity, of transition metal oxide, e.g. tantalum oxide $Ta_2O_5$ is formed on the inner wall and periphery of openings 204a and 215. An electrode layer 218 of refractory metal, e.g. tungsten W, molybdenum Mo, etc. or its silicide, e.g. WSi, MoSi, etc. is formed on the insulating film 217. Thus, a capacitor having a large electrostatic capacitance per a unit area is formed between electrode layer 218 and N+ semiconductor region 212.

On the other hand, a contact hole 220 is formed in insulating films 213 and 214 provided on the surface of lightly doped N semiconductor region 211 on N+ buried layer 202, and an electrode layer 221 of ternary alloy having a smaller barrier height to Si, e.g. $PtAl_2Si$ and an Al layer 224 are successively formed on the surface of lightly doped N semiconductor region 211 inside the contact hole 220. This electrode layer 221 can be formed, for example, by first forming a platinum silicide (PtSi) layer on the surface of semiconductor region 221 and thereafter evaporating Al layer 224 and sintering it through treatment at about 400° C. so as to react Al with PtSi.

Namely an insulating film 219 of e.g. a PSG (phospho silicate glass) film is formed on electrode layer 218 (on insulating film 214 outside the electrode layer 218) at the capacitor side, and contact hole 220 corresponding to said electrode layer 221 is formed in this insulating film 219. The Al layer 224 is formed on insulating film 219 so as to make a connection of the capacitor with SBD at the contact hole 220.

In this embodiment, the capacitor and SBD that have electrode structures different from each other are formed on the common N+ buried layer 202 encircled by trench isolation region 209. This permits the memory cell to be enhanced in its integration degree by the extent of the isolation region as compared with the case where the capacitor and SBD are formed in different regions.

Moreover, in this embodiment, the impurity concentration of semiconductor region 212 that constitutes the capacitor is made greater than that of semiconductor region 211. This permits the desired forward voltage $V_F$ to be provided at the diode section because of the low impurity concentration of semiconductor region 211, and permits, at the capacitor section, the value of the resistor connected in series with the capacitor to be made smaller because of the high impurity concentration of semiconductor region 212, thereby improving the high frequency characteristic of the capacitor.

Meanwhile, in order to form N+ semiconductor region 212, doped N impurities must be deeply thermally diffused so as to reach N+ buried layer 202. At this time, if trench isolation region 209' is not located between semiconductor region 212 for the capacitor and semiconductor region 211, said N impurities are also laterally diffused. Therefore, in order to prevent the N+ semiconductor region 212 for the capacitor from making contact with the electrode layer of the diode, N+ buried layer 202 must be prepared so as to have a larger area, and also sufficient alignment allowance must be offered between a mask for N impurity implantation and a mask for providing the contact hole of semiconductor region 211. As a result, a very large area is occupied by the diode region and capacitor region.

On the other hand, in this embodiment, it is not necessary to consider the lateral diffusion of N impurities since shallow trench isolation region 209' is located between N semiconductor region 211 and N+ semiconductor region 212.

Thus, it is possible to prepare N+ semiconductor region 212 with a smaller area and also it is not necessary to consider alignment allowance of the N impurity implantation mask. Accordingly, the area of N+ buried layer 202 and the semiconductor regions 211 and 212 thereon, i.e., the area occupied by the diode and capacitor regions is considerably reduced, providing the memory cells with a high integration degree.

Further, since in this embodiment, ternary alloy is employed as electrode layer 221 of SBD, an Al layer can be directly provided thereon. Thus, the step for forming a barrier electrode layer becomes unnecessary and so the fabrication process can be simplified.

More specifically, in the prior art, in the case where a metal silicide layer of e.g. PtSi, Pd$_2$Si, etc. is provided on the surface of semiconductor region for SBD to decrease the barrier height $\phi_B$, a barrier electrode layer of e.g. TiW is located between the metal silicide layer and the Al layer in order to prevent $\phi_B$ from becoming zero as a result of eutectic reactions of the metal silicide layer with the Al layer later formed. However, the inventors of this invention have found that if the ternary alloy such as PtAl$_2$Si is used to form the diode electrode layer, the barrier electrode is not required and also $\phi_B$ of 0.72 eV is obtained, thereby having completed the electrode structure in this embodiment.

Incidentally, although in this embodiment PtAl$_2$Si was used as the ternary alloy, any other ternary alloy making unnecessary the barrier electrode can also be used. Metal containing copper Cu added to the ternary alloy such as PtAl$_2$Si can be used to form the diode electrode layer.

Figure 12:
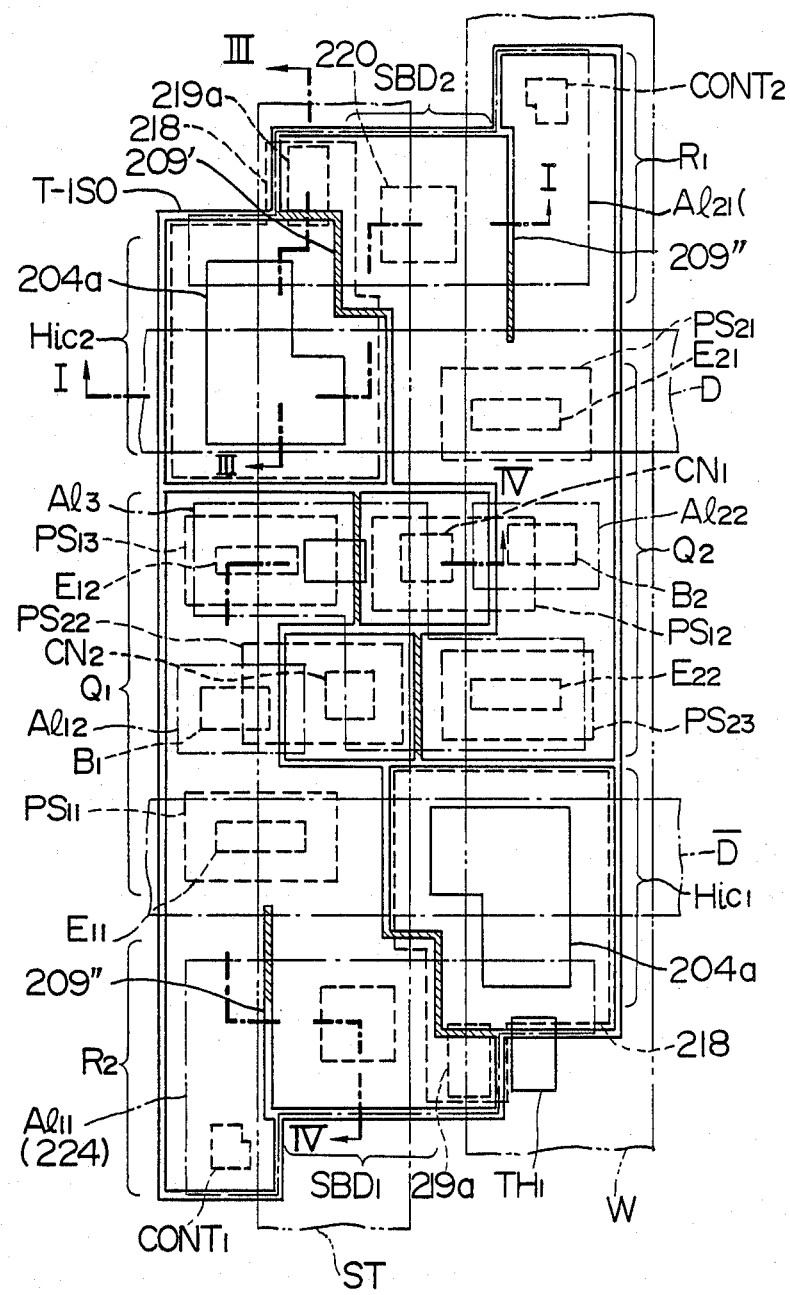
FIG. 12 is a plan view of the memory device according to a still further embodiment of this invention.

Referring to FIG. 12, an explanation will be given for a memory cell layout when the diode and capacitor constructed as mentioned above are applied to the emitter coupled memory cell as shown in FIG. 1.

A memory line in the direction of a word line is constructed by arranging a plurality of memory cells in accordance with the layout as shown in FIG. 8 in such a manner that a memory cell is intimately engaged with the adjacent memory cell in the vertical direction. A plurality of such memory lines are arranged in the horizontal direction so as to construct a matrix shape of memory array.

In FIG. 12, symbols SBD$_1$ and SBD$_2$ denote regions where Schottky barrier diodes D$_1$ and D$_2$ are to be formed, respectively, and regions R$_2$ and R$_1$ where resistor R$_2$ and R$_1$ are to be formed, respectively, are located adjacently to SBD$_1$ and SBD$_2$, respectively. In this embodiment, the first Al layer 224 provided over SBD$_1$ (SBD$_2$) is also extended over R$_2$ (R$_1$) and is in contact with a P$^-$ diffused layer 234 (see FIG. 14) on the semiconductor substrate surface through contact holes CONT$_1$ and CONT$_2$. Thus, the anode terminal of SBD D$_1$ (D$_2$) is connected with one terminal of resistor R$_2$ (R$_1$).

In succession to SBD$_1$, SBD$_2$ and R$_2$, R$_1$, substantially " " shape regions Q$_1$ and Q$_2$ where transistors Q$_1$ and Q$_2$ are to be formed are placed. At the boundary portions between Q$_1$, Q$_2$ and R$_2$, R$_1$, or one end of Q$_1$ and Q$_2$, first emitter areas E$_{11}$ and E$_{21}$ are placed and polysilicon layers PS$_{11}$ and PS$_{21}$ are placed on E$_{11}$ and E$_{21}$, respectively.

Collector extraction areas CN$_1$ and CN$_2$ are located at the other ends of Q$_1$ and Q$_2$, respectively, and base contact holes B$_2$ and B$_1$ located in Q$_2$ and Q$_1$ adjacent to CN$_1$ and CN$_2$, respectively. CN$_1$ and CN$_2$ are not particularly limited except that CN$_1$ and CN$_2$ are connected, through polysilicon layers PS$_{12}$ and PS$_{22}$, with base extraction electrodes Al$_{22}$ and Al$_{12}$ formed on base contact holes B$_2$ and B$_1$, respectively. Thus, transistors Q$_1$ and Q$_2$ are brought into contact with each other so that the base and collector of one transistor are connected with the collector and base of the other transistor, respectively. Base extraction electrodes Al$_{12}$ and Al$_{22}$ are formed with the first Al layer 224.

Further, a second emitter area E$_{12}$ (E$_{22}$) is located between collector extraction region CN$_1$ (CN$_2$) and base contact hole B$_1$ (B$_2$). Polysilicon layers PS$_{13}$ and PS$_{23}$ are formed on the second emitter areas E$_{12}$ and E$_{22}$, respectively, and are connected with each other through the first Al layer Al$_3$.

A region Hi C$_1$ (Hi C$_2$) where a capacitor is to be formed is located adjacently to emitter region E$_{11}$ (E$_{21}$) at the side opposite to resistor region R$_2$ (R$_1$) with respect to SBD$_1$ (SBD$_2$). A capacitor electrode layer 218 formed so as to cover capacitor region Hi C$_1$ (Hi C$_2$) is extended toward the exterior of the memory cell, i.e. the side of SBD$_1$ (SBD$_2$). Al layer 224 formed so as to cover resistor region R$_2$ (R$_1$) and SBD$_1$ (SBD$_2$) is extended toward capacitor region Hi C$_1$ (Hi C$_2$) so as to overlap with capacitor electrode layer 218 and connected with the latter at contact hole 219a.

A data line D ($\overline{D}$) of the first Al layer is arranged over capacitor region Hi C$_1$ (Hi C$_2$) and emitter region E$_{11}$ (E$_{21}$) adjacent thereto and is in contact with polysilicon layer PS$_{11}$ (PS$_{21}$).

A word line W of a second Al layer and standby line ST through which a standby current is passed are arranged in parallel to each other over the memory cell constructed in accordance with said layout so that they lie at right angles to data lines D and $\overline{D}$.

Word line W is connected with Al$_{11}$ (Al$_{21}$) serving as the anode terminal of Schottky barrier diode D$_1$ (D$_2$) through a through-hole TH$_1$. Al layer Al$_{21}$ is connected with word line W in such a way that it is formed integrally to Schottky barrier diode D$_1$ in the adjacent memory cell.

Standby line ST makes contact with common connection Al layer Al$_3$ of the second emitter E$_{12}$ and E$_{22}$ through a through-hole TH$_2$, and the standby current flows through emitters E$_{12}$ or E$_{22}$.

A deep trench isolation region T-ISO for element isolation is formed at the periphery of said memory cell and boundary between the symmetrical elements so as to be extended through N+ buried layer 202, and a shallow trench isolation region 209', i.e. hatched portions in FIG. 12 is formed at the boundary between diode region SBD$_1$ (SBD$_2$) and capacitor region Hi C$_1$ (Hi C$_2$). That is, the elements encircled by chain lines F$_1$ and F$_2$ in FIG. 1 are isolated from each other by trench isolation region T-ISO. Incidentally, FIG. 11 shows a section taken along a line XI-XI of FIG. 12.

Figure 13:
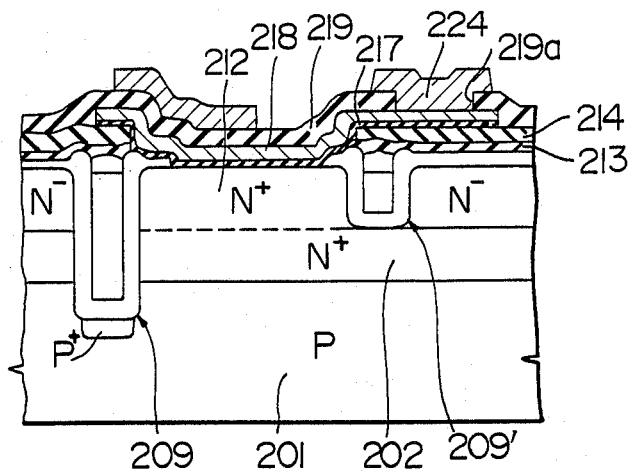
FIGS. 13 and 14 are sectional views of the memory devices according to yet further embodiments of this invention.

In this embodiment, as seen from a section of FIG. 13, capacitor electrode layer 218 is extended over the exterior of N+ semiconductor region 212 (capacitor region Hi C) with PSG film 219 being formed on capacitor electrode layer 218 and connected with Al layer 224 extended from the diode section at contact hole 219a corresponding to the extended part. Thus, even if the refractory metal of capacitor electrode layer 218 reacts with the Al layer 224 evaporated thereon, the contact lies in the exterior of the capacitor so that the reaction does not reach the surface of N+ semiconductor region 212. Moreover, capacitor electrode layer 218 is covered with PSG film 219. Accordingly, the heat resistance at the capacitor section can be considerably improved as compared with the case where a contact between capacitor electrode layer 218 and Al layer 224 is made over N+ semiconductor region.

Further, in this embodiment, the Al wiring layer serving as data line D ($\overline{D}$) is formed on PSG film 219 over N+ semiconductor region 212. Therefore, even if as mentioned above, the capacitor electrode layer is externally extended to make contact with Al layer 224, the memory cell area is not increased, but can be reduced on the contrary.

More specifically, in the previously known emitter coupled memory cell having Schottky barrier diodes, there generally exist some areas where elements are not placed under data lines D and $\overline{D}$. In contrast, in this embodiment, the capacitor is positively placed under the data line while the contact thereof with the Al layer is externally made, so that any redundant unused area hardly occurs, and so the cell area is reduced to the extent, thereby realizing the memory cells with a high integration density.

Figure 14:
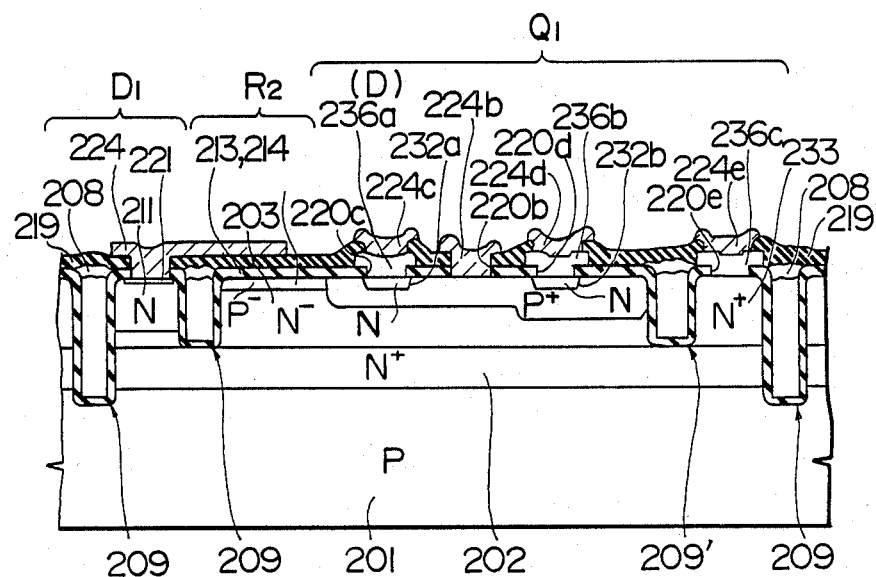

FIG. 14 is a sectional structure taken on line IV-IV of FIG. 12.

In FIG. 14, 231 is a P+ semiconductor region serving as a base area of transistor Q$_1$ (Q$_2$) in the memory cell shown in FIG. 1; 232a and 232b are N+ semiconductor regions serving as emitter area of transistor Q$_1$ (Q$_2$), and 233 is an N+ semiconductor region serving as a collector extraction region of transistor Q$_1$ (Q$_2$).

In this embodiment, h$_{FE}$ (common emitter static forward current transfer ratio) of Q$_1$ (Q$_2$) is adjusted to be an optimum value by varying the thickness of the base area just below emitter areas 232a and 232b, although this can be also carried by any other suitable methods.

N semiconductor region 211 constituting SBD D$_1$ (D$_2$) is formed over N+ buried layer 202 serving as the collector area of transistor Q$_1$ (Q$_2$), and a shallow P− semiconductor region 234 serving as load resistor R$_2$ (R$_1$) is formed between this semiconductor region 211 and base area 231. Trench isolation region 209' is formed between semiconductor regions 211 and 234. This trench isolation region 209' is, as seen from FIG. 12, varied in its depth on the way from the deep portion to the shallow portion (hatched portion). In this way, the N+ buried layer 202 connecting semiconductor region 211 and the collector area of transistor Q$_1$ is varied in its sectional area so as to adjust the value of the resistor inserted in series with diode D$_1$.

Shallow trench isolation region 209' is also formed between base area 231 and collector extraction region 233.

Al layer 224 is formed in insulating films 213, 214 and 219 on the surfaces of N semiconductor region 211 for the diode D$_1$ (D$_2$) and P− semiconductor region 234 serving as a load resistor, and is in contact with SBD D$_1$ (D$_2$) through contact hole 220. By bringing the extended portion of Al layer 224 into contact with the surface of P− semiconductor region 234 at the position not shown, connection is made between the anode terminal of diode D$_1$ (D$_2$) and one terminal of resistor R$_2$ (R$_1$). A contact hole 220b formed in insulating films 213 and 214 on the surface of base area 231 is filled with Al electrode layer 224b serving as a base extraction electrode.

Contact holes 220c to 220e corresponding to emitter areas 232a, 232b and collector extraction region 233, formed in insulating films 213 and 214 on the substrate surface are filled with polysilicon electrodes 236a to 236c on which Al electrode layers 224c to 224e are formed through insulating film 219.

The semiconductor device in accordance with this embodiment of the invention has the following main advantages.

(1) Since a lightly doped semiconductor region and a highly doped semiconductor region that are isolated from each other by a relatively shallow isolation region are formed, with a capacitor formed by depositing a refractory metal layer on the surface of said highly doped semiconductor region through an insulating film of transition metal oxide having a high permittivity such as tantalum oxide Ta$_2$O$_5$, in a semiconductor region formed on a highly doped buried layer encircled by a relatively deep isolation region so as to provide individual desired characteristics for a diode and capacitor, the memory cell having diodes and capacitors will be improved in its operation speed and operation allowance degree, and not decreased in its integration density.

(2) Since a lightly doped semiconductor region and a highly doped semiconductor region that are isolated from each other by a relatively shallow isolation region are formed, with a capacitor formed by depositing a refractory metal layer on the surface of said highly doped semiconductor region through an insulating film of transition metal oxide having a high permittivity such as Ta$_2$O$_5$, in a semiconductor region formed on a highly doped buried layer encircled by a relatively deep isolation region so as to prevent, by said shallow isolation region, impurities from said highly doped semiconductor region from being laterally diffused, the area occupied by the capacitor and a diode is a decreased, thereby giving memory cells with a high integration degree.

(3) Since a lightly doped semiconductor region and a highly doped semiconductor region that are isolated from each other by a relatively shallow isolation region are formed, with a capacitor formed by depositing a refractory metal layer on the surface of said highly doped semiconductor region through an insulating film of transition metal oxide having a high permittivity such as Ta$_2$O$_5$ and with a Schottky barrier diode formed by depositing on said lightly doped semiconductor region an electrode layer of ternary alloy having a low barrier height $\phi_B$, in a semiconductor region formed on a highly doped buried layer encircled by a relatively deep isolation region so as to eliminate the necessity of inserting a barrier electrode layer between the lightly doped semiconductor region and an upper Al wiring layer. The fabrication process of the memory cell can be simplified.

(4) Since a capacitor electrode layer is extended over the exterior of an N+ semiconductor region (capacitor region) with a PSG film being formed on the capacitor electrode layer and connected with an Al layer extended from a diode section at a contact hole corresponding to the extended part in order that even if the refractory metal of the capacitor electrode layer reacts with the Al layer evaporated thereon, the contact lies in the exterior of the capacitor so that the reaction does not reach the surface of the N+ semiconductor region, the heat resistance at the capacitor section will be improved.

(5) Since a capacitor electrode layer is extended over the exterior of an N+ semiconductor region (capacitor region) with a PSG film being formed on the capacitor electrode layer and connected with an Al layer extended from a diode section at a contact hole corresponding to the extended part and an Al wiring layer serving as a data line is formed on the PSG film in order that any redundant unused area hardly occurs, the cell area is reduced, thereby realizing the memory cell with a high integration density.

It will be apparent to those skilled in the art that this invention is not limited to the embodiments mentioned above but various modifications can be made within the spirit and scope of this invention.

We claim:

1. A semiconductor memory device comprising a digit line, a word line crossing the digit line, a first insulating film disposed between said digit line and said word line, two transistors in cross connection with each other, a load and a Schottky barrier diode connected in parallel with each other between each of said transistors and said word line wherein at least a part of said Schottky barrier diode is provided under said digit line, and a second insulating film disposed between said Schottky barrier diode and said digit line.

2. A semiconductor memory device according to claim 1, wherein said Schottky barrier diode has an electrode of a material selected from the group consisting of PtSi, AlPt and Pd$_2$Si.

3. A semiconductor memory device according to claim 1, wherein said load is a resistor.

4. A semiconductor memory device according to claim 1, wherein said second insulating film has a thickness greater than about 2,000 Å.

5. A semiconductor memory device comprising a digit line, a word line crossing the digit line, a first insulating film disposed between said digit line and said word line, two transistors in cross connection with each other, a combination of a load a Schottky barrier diode and a capacitor which are connected in parallel with one another, wherein at least a part of said capacitor is provided under said digit line, and a second insulating film disposed between said capacitor and said digit line.

6. A semiconductor memory device according to claim 5, wherein said Schottky barrier diode has an electrode of a material selected from the group consisting of Ptsi, AlPt and Pd$_2$Si.

7. A semiconductor memory device according to claim 5, wherein said load is a resistor, 8. A semiconductor memory device according to claim 5, wherein said second insulating film has a thickness greater than about 2,000 Å.

9. A semiconductor memory device according to claim 5, wherein said Schottky diode and barrier said load have a common electrode electrically connected with said word line.

10. A semiconductor memory device according to claim 5, wherein said capacitor includes a dielectric insulating film comprising Ta$_2$O$_5$.

11. A semiconductor device comprising:
a semiconductor region formed in a semiconductor substrate, said semiconductor region having a first major surface, wherein said semiconductor region includes first and second portions located adjacent to one another to occupy different areas of the first major surface, and further wherein an impurity concentration of said first portion is greater than an impurity concentration of said second portion;
a Schottky barrier diode formed by a first electrode formed directly on said second portion of said semiconductor region; and
a capacitor formed by the first portion of the semiconductor region, an insulating film formed over the first portion and a second electrode, different from said first electrode, formed on said insulating film,
wherein said semiconductor region is common to both said Schottky barrier diode and said capacitor;
wherein said semiconductor region includes a highly doped buried layer connecting said first and second portions of said semiconductor region, and said buried layer is connected with another highly doped buried layer serving as a collector area of a vertical transistor formed at another position of said semiconductor substrate different from a portion where said semiconductor region is formed.

12. A semiconductor device comprising:
a semiconductor region formed in a semiconductor substrate, said semiconductor region having a first major surface, wherein said semiconductor region includes first and second portions located adjacent to one another to occupy different areas of the first major surface, and further wherein an impurity concentration of said first portion is greater than an impurity concentration of said second portion;
a Schottky barrier diode formed by a first electrode formed directly on said second portion of said semiconductor region; and
a capacitor formed by the first portion of the semiconductor region, an insulating film formed over the first portion and a second electrode, different from said first electrode, formed on said insulating film,
wherein said semiconductor region is common to both said Schottky barrier diode and said capacitor;
wherein the second electrode is formed of a refractory metal or its silicide and the insulating film of said capacitor is formed of a transition metal oxide.

13. A semiconductor device comprising:
a semiconductor region formed in a semiconductor substrate, said semiconductor region having a first major surface, wherein said semiconductor region includes first and second portions located adjacent to one another to occupy different areas of the first major surface, and further wherein an impurity concentration of said first portion is greater than an impurity concentration of said second portion;

a Schottky barrier diode formed by a first electrode formed directly on said second portion of said semiconductor region; and a capacitor formed by the first portion of the semiconductor region, an insulating film formed over the first portion and a second electrode, different from said first electrode, formed on said insulating film, wherein said semiconductor region is common to both said Schottky barrier diode and said capacitor;

wherein said Schottky barrier diode is formed at a contact hole provided on the surface of said first portion of the semiconductor region at a position apart from an end of an isolation region surrounding said first and second portions, and further wherein said Schottky barrier diode includes said first electrode being formed of metal silicide having a barrier height $\phi_B$ less than 0.9 eV and a barrier electrode formed on said electrode.

14. A semiconductor device according to claim 13, wherein said barrier electrode layer is made of conductive material containing Ti, and further wherein said barrier electrode extends over the capacitor region so as to be in contact with the second electrode of said capacitor.

15. A semiconductor device according to claim 14, wherein a second insulating film is formed on said second electrode layer of the capacitor, and said barrier second electrode layer is extended so as to be in contact with the electrode layer of the capacitor through a contact hole provided in said second insulating film.

16. A semiconductor device comprising:

two semiconductor portions formed in a common semiconductor region in one principal surface of a semiconductor substrate, one portion constituting a Schottky carrier diode and having a first electrode layer directly formed thereon, the other of the two portions constituting a capacitor and having a second electrode layer formed thereon through a first insulating film, said capacitor portion being more highly doped than said diode portion and both portions being isolated from each other by an isolation region;

wherein the second electrode on said capacitor is made of refractory metal and said first insulating film is made of transition metal oxide.

17. A semiconductor device comprising:

two semiconductor portions formed in a common semiconductor region in one principal surface of a semiconductor substrate, one portion constituting a Schottky barrier diode and having a first electrode layer directly formed thereon, the other of the two portions constituting a capacitor and having a second electrode layer formed thereon through a first insulating film, said capacitor portion being more highly doped than said diode portion and both portions being isolated from each other by an isolation region;

wherein the first electrode layer on said Schottky barrier diode region is made of ternary alloy;

wherein the second electrode on said capacitor is made of refractory metal and said first insulating film is made of transition metal oxide.

* * * * *